US006762455B2

(12) United States Patent
Oppermann et al.

(10) Patent No.: US 6,762,455 B2
(45) Date of Patent: Jul. 13, 2004

(54) SEMICONDUCTOR COMPONENT FOR HIGH REVERSE VOLTAGES IN CONJUNCTION WITH A LOW ON RESISTANCE AND METHOD FOR FABRICATING A SEMICONDUCTOR COMPONENT

(75) Inventors: Klaus-Günter Oppermann, Holzkirchen (DE); Jenö Tihanyi, Kirchheim (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/095,270

(22) Filed: Mar. 11, 2002

(65) Prior Publication Data

US 2002/0117715 A1 Aug. 29, 2002

Related U.S. Application Data

(63) Continuation of application No. PCT/EP00/08706, filed on Sep. 6, 2000.

(30) Foreign Application Priority Data

Sep. 9, 1999 (DE) .......................................... 199 43 143

(51) Int. Cl.[7] .............................................. H01L 29/76
(52) U.S. Cl. ....................... 257/335; 257/339; 257/341; 257/342
(58) Field of Search ................................ 257/335, 339, 257/341, 342

(56) References Cited

U.S. PATENT DOCUMENTS 5,917,203 A * 6/1999 Bhatnagar et al. .......... 257/139
6,274,904 B1 * 8/2001 Tihanyi ...................... 257/329
6,452,230 B1 * 9/2002 Boden, Jr. .................. 257/341

FOREIGN PATENT DOCUMENTS

| DE | 195 34 154 C2 | 3/1997 |
| DE | 198 39 970 A1 | 3/2000 |
| DE | 198 39 970 C2 | 3/2000 |
| EP | 0 344 514 A2 | 12/1989 |
| WO | WO 97/29518 | 8/1997 |
| WO | WO 00/17937 | 3/2000 |

* cited by examiner

*Primary Examiner*—Mark V. Prenty
(74) *Attorney, Agent, or Firm*—Laurence A. Greenberg; Werner H. Stemer; Ralph E. Locher

(57) ABSTRACT

A semiconductor component includes a semiconductor body of a first conductivity type which accommodates a space charge region. Semiconductor regions of a second conductivity type are disposed in at least one plane extending essentially perpendicularly to a connecting line extending between two electrodes. A cell array is disposed under one of the electrodes in the semiconductor body. At least some of the semiconductor regions of the second conductivity type are connected to the cell array via filiform semiconductor zones of the second conductivity type in order to expedite switching processes. A method for fabricating such a semiconductor component is also provided.

9 Claims, 5 Drawing Sheets

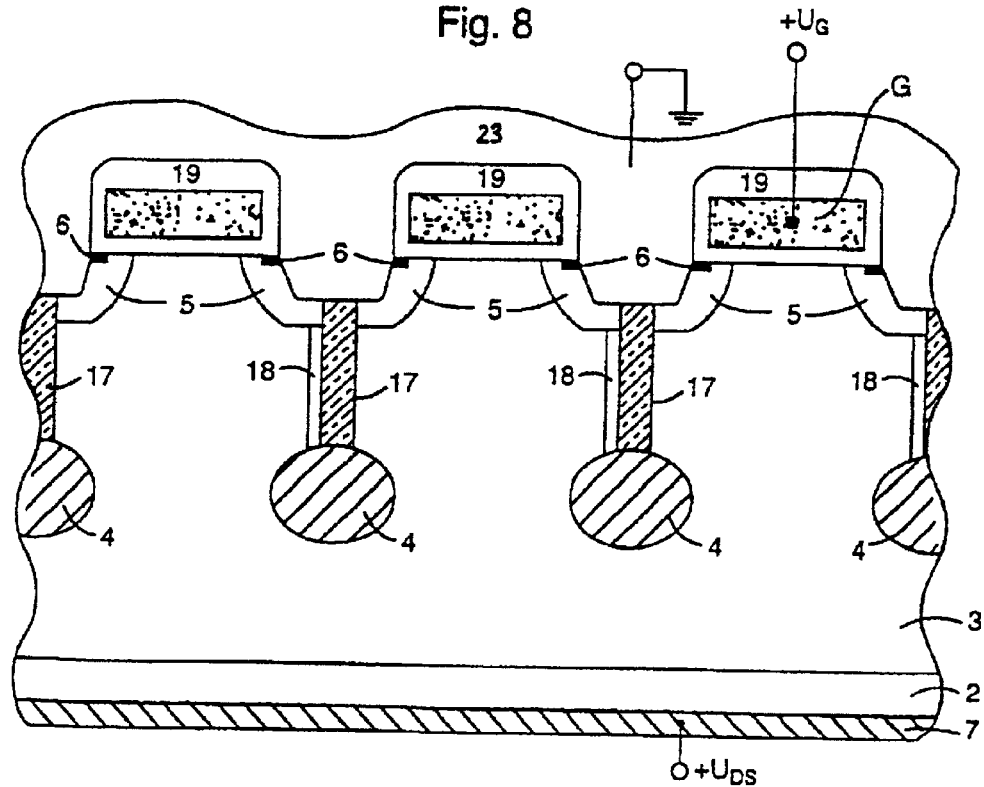
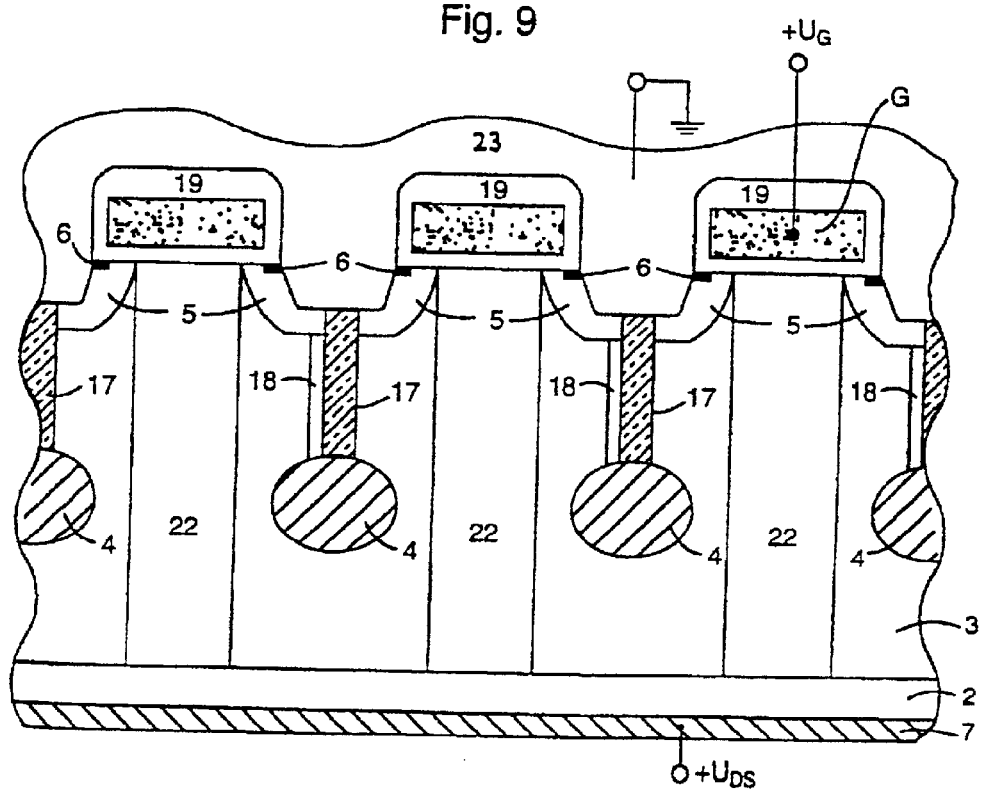

SEMICONDUCTOR COMPONENT FOR HIGH REVERSE VOLTAGES IN CONJUNCTION WITH A LOW ON RESISTANCE AND METHOD FOR FABRICATING A SEMICONDUCTOR COMPONENT

CROSS-REFERENCE TO RELATED APPLICATION

This application is a continuation of copending International Application No. PCT/EP00/08706, filed Sep. 6, 2000, which designated the United States.

BACKGROUND OF THE INVENTION

Field of the Invention

The invention relates to a semiconductor component having a semiconductor body of a first conductivity type. A semiconductor region of the first conductivity type is provided between two electrodes and can sustain a reverse voltage applied to the electrodes. Semiconductor regions of a second conductivity type, opposite to the first conductivity type, are provided in at least one plane extending essentially perpendicularly to a connecting line between the two electrodes. A cell array is disposed below one of the electrodes in the semiconductor body.

Unipolar power semiconductor components for high reverse voltages have a high on resistance due to the required low doping concentration of the semiconductor region that takes up the space charge zone. If the doping concentration is increased in this semiconductor region, then the blocking capability of the power semiconductor component decreases.

In order to solve this problem, additional, buried pn junctions can be produced in the bulk of the semiconductor region that takes up the reverse voltage. European Patent No. EP 0 344 514 B1 has already proposed a turn-off thyristor in which there is inserted into a base layer, which is not contact-connected by a gate electrode, at least one thin semiconductor layer which is not connected up to external potentials and is doped oppositely relative to the base layer. Instead of such a non-contact-connected layer, at the present time preferably laterally uniformly distributed spherical semiconductor regions, which, if appropriate, can also form a network, are introduced into the semiconductor region that takes up the space charge zone, the semiconductor regions, having a conductivity type opposite to the conductivity type of the semiconductor region. The semiconductor regions are preferably floating. With a configuration of this type, the maximum electric field strength that occurs is limited depending on the basic doping in the semiconductor region and the distance between the electrically floating regions of the opposite conductivity type to the conductivity type of the semiconductor region.

International Publication No. WO 97/29518 describes a power semiconductor component according to the principle of charge carrier compensation. In that case, the drift zone of the semiconductor component has regions of different conductivity types, the total quantity of charge carriers of different conductivity types being approximately the same in these regions. When a reverse voltage is applied, the regions are mutually depleted, with the result that the semiconductor component exhibits an improved blocking capability. By virtue of the fact that the drift zone simultaneously has a higher doping concentration, the on resistance $R_{on}$ is significantly reduced in the case of such a semiconductor component.

The fabrication of, for example, p-conducting semiconductor regions in an n-conducting semiconductor region can be effected through the use of a multistage epitaxy, in association with a phototechnology and a subsequent ion implantation.

If, in the semiconductor body of a semiconductor component, a plurality of such semiconductor regions of the second conductivity type which are provided essentially parallel to one another in different planes are cascaded in a semiconductor region of the first conductivity type, so that there are thus p-doped floating semiconductor regions, for example, in an n-conducting semiconductor region —which takes up the space charge zone —in different planes perpendicular to the connection direction between source electrode and drain electrode, then high reverse voltages in conjunction with a low on resistance $R_{an}$ can be achieved with a semiconductor component of this type. In this way, it is thus possible to fabricate, for example, MOSFETs (Metal Oxide Semiconductor Field Effect Transistors) with a high reverse voltage together with a low on resistance $R_{on}$.

One disadvantage of electrically floating semiconductor regions of the second conductivity type in a semiconductor region —which takes up or accommodates the space charge zone —of the first conductivity type can be seen, however, in the fact that, especially in unipolar semiconductor components, the floating semiconductor regions delay switching operations: such slow switching operations are caused by the lack of coupling of the semiconductor regions of the second conductivity type to the source electrode or cathode, for example, via a unipolar conduction path.

SUMMARY OF THE INVENTION

It is accordingly an object of the invention to provide a semiconductor component for high reverse voltages in conjunction with a low on resistance which overcomes the above-mentioned disadvantages of the heretofore-known semiconductor components of this general type and in which switching operations proceed rapidly. It is a further object of the invention to provide a method for fabricating such a semiconductor component.

With the foregoing and other objects in view there is provided, in accordance with the invention, a semiconductor component, including:

two electrodes;

a semiconductor body of a first conductivity type, the semiconductor body including a semiconductor region of the first conductivity type provided between the two electrodes, the semiconductor region of the first conductivity type being configured to sustain a reverse voltage applied to the electrodes;

semiconductor regions of a second conductivity type disposed in at least one plane extending essentially perpendicularly to a connecting line extending between the two electrodes, the second conductivity type being opposite to the first conductivity type;

a cell array disposed under one of the electrodes in the semiconductor body; filiform semiconductor zones of the second conductivity type; and at least some of the semiconductor regions of the second conductivity type being connected to the cell array via the filiform semiconductor zones of the second conductivity type.

In other words, a semiconductor component according to the invention includes a semiconductor body of the first conductivity type, in which a semiconductor region of the first conduction type is provided between two electrodes, which region takes up a reverse voltage (blocking voltage) applied to the electrodes and in which region semiconductor regions of the second conductivity type, opposite to the first conductivity type, are provided in at least one plane extending essentially perpendicularly to the connecting line between the two electrodes, and in which a cell array is situated below one of the electrodes in the semiconductor body, wherein the semiconductor regions of the second conduction type are connected to the cell array at least partly via filiform semiconductor zones of the second conduction type.

In the case of a semiconductor component of the type mentioned above, the object of the invention is achieved according to the invention by virtue of the fact that the semiconductor regions of the second conductivity type are connected to the cell array at least partly via the filiform semiconductor zones of the second conductivity type, which are doped more weakly than the semiconductor regions of the second conductivity type.

According to another feature of the invention, the filiform semiconductor zones have a cross-sectional configuration, of a cylinder, a cross-sectional configuration of a parallelepiped or a cross-sectional configuration of a strip.

According to yet another feature of the invention, the semiconductor body has an edge region; and given ones of the semiconductor regions of the second conductivity type are disposed in the edge region of the semiconductor body and are configured as floating semiconductor regions. For edge structures, it is expedient here for not all the semiconductor regions of the second conductivity type to be connected to the source electrode via the filiform zones of the second conductivity type. Rather, it is advantageous if floating semiconductor regions of the second conductivity type are present in the edge structure, the regions not being connected to the source electrode via the filiform zones.

According to another feature of the invention, the semiconductor region of the first conductivity type have, relatively more weakly doped zones and relatively more heavily doped zones extending in a direction between two electrodes such that the semiconductor regions of the second conductivity type are provided in the relatively more weakly doped zones, and such that the relatively more heavily doped zones extend in the semiconductor body substantially below the gate electrodes.

According to a further feature of the invention, the semiconductor region of the first conductivity type has a first dopant concentration; and doped zones of the first conductivity type are incorporated into the semiconductor is region of the first conductivity type, the doped zones have a second dopant concentration greater than the first dopant concentration.

According to yet another feature of the invention, the semiconductor region of the first conductivity type includes surface zones disposed below the gate electrodes and doped more heavily than a remainder of the semiconductor region of the first conductivity type.

According to a further feature of the invention, the filiform semiconductor zones have a dopant concentration of less than $10^{16}$ charge carriers $cm^{-3}$.

According to another feature of the invention, each of the filiform semiconductor zones has a center, an outer edge and a total charge integrated from the outer edge to the center, the filiform semiconductor zones are configured such that the total charge is less than a breakdown charge.

According to yet a further feature of the invention, the filiform semiconductor zones are doped more weakly than the semiconductor regions of the second conductivity type.

With the objects of the invention in view there is also provided, a method for fabricating a semiconductor component, the method includes the steps of:

providing a semiconductor body having a semiconductor region of a first conductivity type;

etching holes into the semiconductor region of the first conductivity type;

subsequently implanting dopants of a second conductivity type opposite the first conductivity type at a bottom of each of the holes;

producing semiconductor regions of the second conductivity type by driving the dopants into the semiconductor region of the first conductivity type;

subsequently extending the holes deeper into the semiconductor region of the first conductivity type by performing an anisotropic etching;

subsequently implanting dopants of the second conductivity type at the bottom of each of the holes; and connecting at least some of the semiconductor regions of the second conductivity type toga cell array disposed in the semiconductor body via filiform semiconductor zones of the second conductivity type.

With the objects of the invention in view there is further provided, a method for fabricating a semiconductor component, the method includes the steps of:

providing a semiconductor body of a first conductivity types the semiconductor body including a semiconductor region of the first conductivity type;

providing semiconductor regions of a second conductivity type disposed in at least one plane extending essentially perpendicularly to a connecting line extending between two electrodes, the second conductivity type being opposite the first conductivity type;

providing a cell array disposed under one of the electrodes in the semiconductor body;

fabricating filiform semiconductor zones of the second semiconductor type by introducing trenches into the semiconductor region of the first conductivity type as far as the semiconductor regions of the second conductivity type by providing the trenches with zones of the second conductivity type in side walls of the trenches, and by filling the trenches with an insulating material; and connecting, via the filiform semiconductor zones of the second conductivity type, at least some of the semiconductor regions of the second conductivity type to a cell array disposed in the semiconductor body.

With the objects of the invention in view there is also provided, a method for fabricating a semiconductor component, the method includes the steps of:

providing a semiconductor body of a first conductivity type, the semiconductor body including a semiconductor region of the first conductivity type;

providing semiconductor regions of a second conductivity type disposed in at least one plane extending essentially perpendicularly to a connecting line extending between two electrodes, the second conductivity type being opposite the first conductivity type;

fabricating filiform semiconductor zones of the second semiconductor type by introducing holes into the semiconductor region of the first conductivity type such that the holes have a respective cross section tapering conically toward a hole bottom; and connecting, via the filiform semiconductor zones of the second conductivity type, at least some of the semiconductor regions of the second conductivity type to a cell array disposed in the semiconductor body.

In other words, in a method for fabricating the semiconductor component according to the invention, a hole is introduced into the semiconductor region of the first conductivity type by anisotropic etching. Boron, for example, is subsequently implanted into the hole, in the bottom thereof. After a brief drive-out of the dopant, further anisotropic etching is then effected, and then implantation is again effected into the bottom of the hole. This sequence can be repeated until the desired number of planes with semiconductor regions of the second conductivity type has been produced. Finally, after the last doping of the hole bottom, the hole is filled with dopant by epitaxy. Instead of such in-situ-doped epitaxy, however, it is also possible to fill the holes with insulating material, such as silicon dioxide for example. This can be done when the filiform zone of the second conductivity type runs in the edge of a hole, for example, which can be done by ion implantation into hole walls that taper somewhat obliquely downward. In this case, there is a high doping concentration with much boron, for example, at the bottom of a hole, while the side walls thereof are only weakly doped with boron. This weak doping suffices, however, to connect the individual semiconductor regions, which are p-doped in the present example, to the source electrode in a unipolar manner.

Thus, in the case of the semiconductor component according to the invention, filiform, weakly doped zones of the second conductivity type with a doping concentration of, for example, less than $10^{16}$ charge carriers $cm^{-3}$ are provided as "connection cylinder" or "connection parallelepiped" between the highly doped semiconductor regions of the second conductivity type. As a result, the otherwise electrically floating semiconductor regions of the second conductivity type are resistively connected to the cell array or to the source.

When a voltage is applied to source and drain, in the case of in the semiconductor component according to the invention, firstly the n-conducting semiconductor region is depleted simultaneously via all the p-conducting semiconductor regions that are connected to one another by doping threads.

The interspace between the semiconductor regions of the second conductivity type is thus depleted of free charge carriers, in order to produce the space charge zone there, which can take up an electrical voltage. If, in the filiform semiconductor zones of the second conductivity type, the total charge, integrated from the outer edge of the filiform zone as far as the center thereof, is less than the breakdown charge, which is related to the breakdown voltage by Maxwell's third equation, the filiform zone is completely depleted, so that the space charge zone can be built up for taking up the electrical voltage.

In other words, in the case of the semiconductor component according to the invention, the filiform zone thus connects all the semiconductor regions of the second conductivity type to the source electrode via a resistive path, without impeding the buildup of a space charge zone.

The filiform zones of the second conductivity type which connect the semiconductor regions of the second conductivity type to one another enable the semiconductor regions of the second conductivity type to be rapidly discharged after a switch-on. In other words, the switch-on operation is significantly accelerated.

Other features which are considered as characteristic for the invention are set forth in the appended claims.

Although the invention is illustrated and described herein as embodied in a semiconductor component for high reverse voltages in conjunction with a low on resistance and method for fabricating such a semiconductor component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 8 to 11 are diagrammatic sectional views of various, further exemplary embodiments of the semiconductor component according to the invention;

DESCRIPTION OF THE PREFERRED EMBODIMENTS

Figure 12:
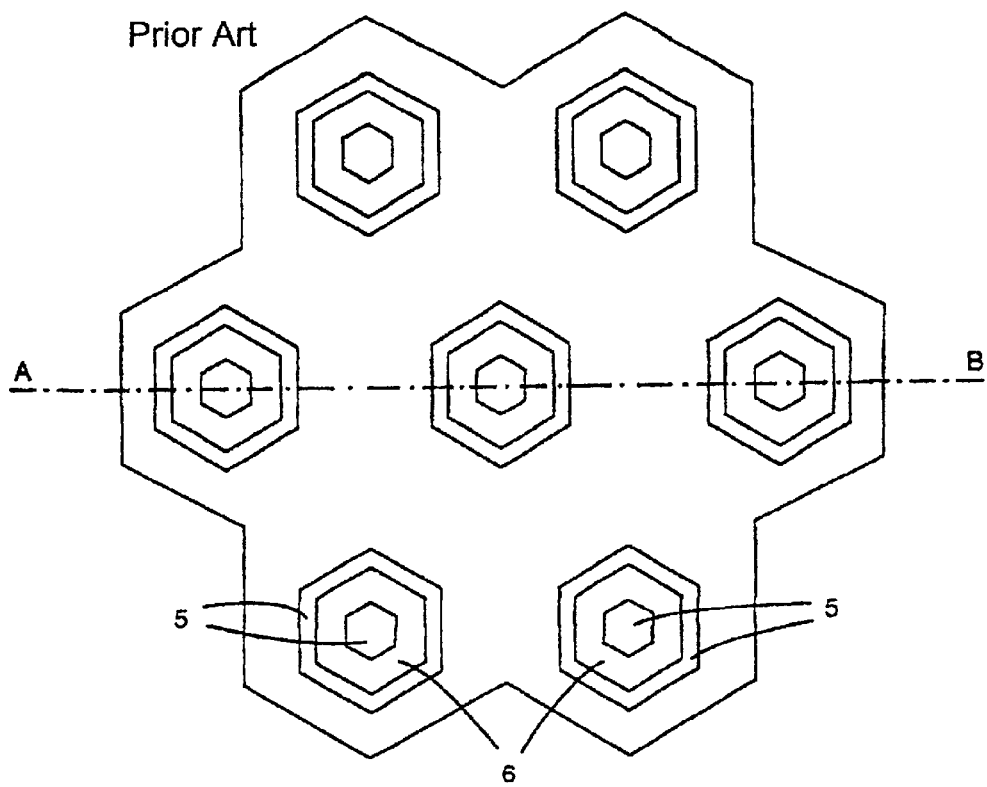
FIG. 12 is a plan view of a conventional semiconductor component.
Figure 13:
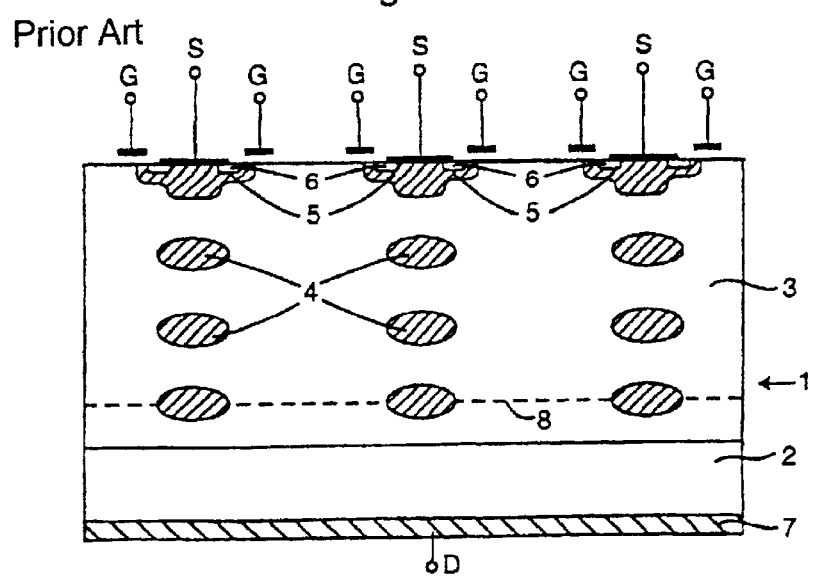
FIG. 13 is a sectional view along section line A-B of the semiconductor component shown in FIG. 12.

Referring now to the figures of the drawings in detail and first, particularly, to FIGS. 12 and 13 thereof, there is shown a conventional semiconductor component which has a semiconductor body 1 including an $n^+$-conducting semiconductor substrate 2 and an n-conducting semiconductor region 3 provided on the $n^+$-conducting semiconductor substrate 2. $p^+$-conducting semiconductor regions 4 are incorporated into the n-conducting semiconductor region 3; the semiconductor regions 4 are in each case floating and may, if appropriate, be joined in a reticular manner in a respective horizontal plane.

Furthermore, p-conducting body zones 5 are shown, into which $n^+$-conducting source zones 6 are incorporated.

FIG. 13, which illustrates a section along section line A-B from FIG. 12, additionally shows gate electrodes G, source electrodes S and, on the surface of the semiconductor body 1 which is opposite to the surface with the gate electrodes G and the source electrodes S, a drain electrode D with a contact layer 7. For better clarity, the gate electrodes G and the source electrodes S are not illustrated in FIG. 12.

The semiconductor body 1 is composed of silicon in a customary manner, while aluminum is used for the electrodes, such as, in particular, the contact layer 7.

If appropriate, the conductivity types may also be reversed, so that the semiconductor substrate 2 and the semiconductor region 3 are p-conducting, while the semiconductor regions 4 are then n-conducting. This also applies, of course, to the exemplary embodiments of the invention that are explained below.

The fabrication of the semiconductor component shown in FIGS. 12 and 13 can be effected for example through the use of a multistage epitaxy in which firstly a first n-conducting epitaxial layer is applied to the semiconductor substrate 2 as go far as a broken line 8. There then follows a first ion implantation, through the use of which ions, such as boron ions, for example, are implanted at the locations of the epitaxial layer at which the bottommost plane of the semiconductor regions 4 is to be formed. These semiconductor regions 4 of the bottommost plane are then produced through the use of a drive-in step which follows the ion implantation. Through the use of further epitaxy processes and ion implantation, the structure shown in FIG. 13 can thus be constructed.

The cascading or series-connecting of the semiconductor regions 4 in a plurality of planes makes it possible to achieve high reverse voltages in conjunction with a low on resistance $R_{on}$, as has already been explained above.

In the case of the conventional semiconductor component, the lack of coupling of the semiconductor regions 4 to the body zone 5 or the source electrode S means that a switching operation proceeds relatively slowly, since the semiconductor regions 4 cannot be rapidly discharged after the switch-on.

Figure 4:
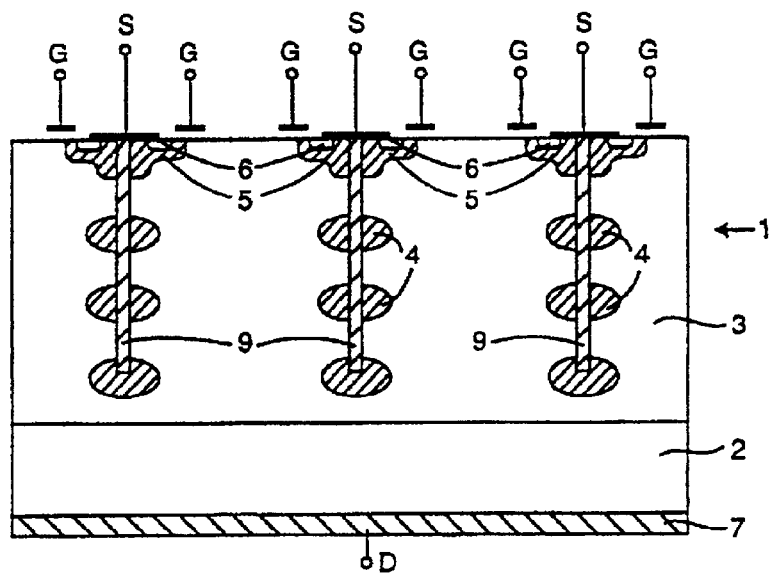

In the case of the semiconductor component according to the invention, this rapid switching is achieved by virtue of the fact that, as is shown in FIG. 4, the individual semiconductor regions 4 are joined vertically to one another via filiform p-doped zones 9. These zones 9 are weakly doped and have a doping concentration of, for example, less than $10^{16}$ charge carriers $cm^{-3}$. The filiform zones 9 form connection cylinders or parallelepipeds and enable the p$^+$-conducting semiconductor regions 4 to be rapidly discharged after the switch-on. In the filiform semiconductor regions 9, the total charge, integrated from their outer edge as far as the center, is less than the breakdown charge. Therefore, when a reverse voltage is applied, the filiform semiconductor zones 9 are completely depleted, so that the space charge zone can be built up for taking up the electrical voltage in the semiconductor region 3. In other words, the filiform semiconductor zone 9 thus connects all the semiconductor regions 4 to the source electrode S via a resistive path, without impeding the buildup of a space charge zone.

An exemplary embodiment of the invention's method for fabricating the semiconductor component is explained below with reference to FIGS. 1 to 4.

Figure 1:
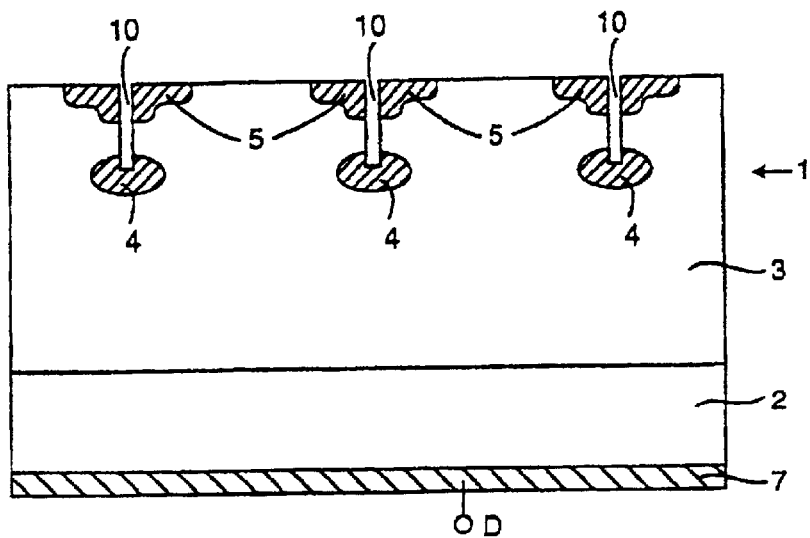
FIGS. 1 to 4 are diagrammatic sectional views of semiconductor is structures for explaining a first exemplary embodiment of the method according to the invention, the semiconductor component a according to the invention being illustrated in FIG. 4.

An n-conducting semiconductor region 3 made of silicon is produced on a semiconductor substrate 2 made of n$^+$-conducting silicon through the use of epitaxy in one or more steps. Through diffusion or implantation, firstly the p-conducting zones 5 are introduced into the semiconductor region 3 through the use of doping with boron. Holes 10 are then etched in the region of the zones 5. There follows an ion implantation in the course of which boron ions, for example, are implanted into the bottom of the holes 10, which, after a brief drive-out of the dopant, form the topmost plane of the semiconductor regions 4. The structure shown in FIG. 1 is thus present,after the fabrication of the contact layer 7.

Figure 2:
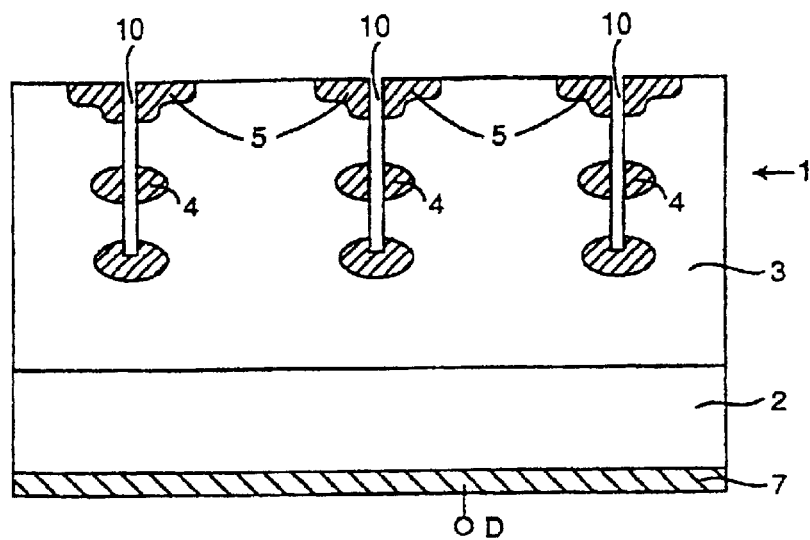

There then follows a further anisotropic etching process, in which the holes 10 are driven more deeply into the semiconductor region 3. Afterward, implantation is again effected into the bottom of the holes 10 deepened in this way, so that the structure shown in FIG. 2 is present after a further drive-out step.

Figure 3:
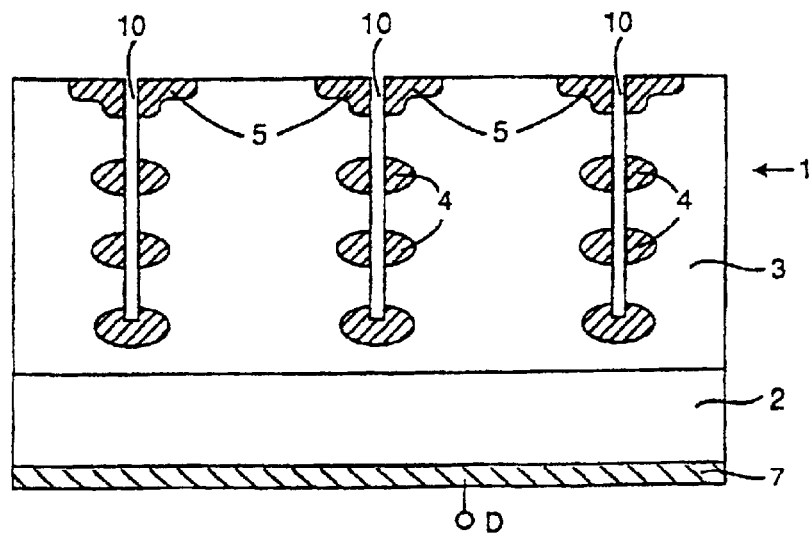

The sequence explained above is repeated until the desired number of planes with semiconductor regions 4 is present. FIG. 3 thus shows a semiconductor component with three different planes of semiconductor regions 4.

Finally, after the last doping of the bottom of the holes 10, i.e. after the fabrication of the "bottommost" plane of the if semiconductor regions 4, the holes 10 are filled for example through the use of in-situ-doped epitaxy, so that the structure of FIG. 3 yields the structure shown in FIG. 4, in which the holes 10 are filled with the p-doped semiconductor material, in particular silicon. As has already been indicated, this semiconductor material has a doping concentration of, for example, less than $10^{16}$ charge carriers $cm^{-3}$. The value of this doping concentration depends on the hole radius, as will be explained in more detail further below.

FIG. 4 also shows additionally with respect to FIG. 3 the source zones 6, the gate electrodes G and the source electrodes S, which can all be fabricated in a customary manner.

The total charge in the filiform zones 9, integrated from the outer edge of the "thread" as far as the center thereof, must be less than the breakdown charge, in order that the thread is completely depleted and the space charge zone can be built up in the blocking case for the purpose of taking up the electrical voltage. The maximum permissible doping concentration in the "thread" then results from this.

Figure 5:
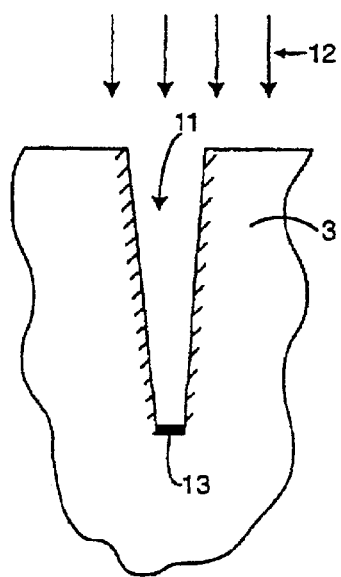
FIGS. 5 to 7 are diagrammatic sectional views of semiconductor structures for elucidating a further exemplary embodiment of the method according to the invention.
Figure 6:
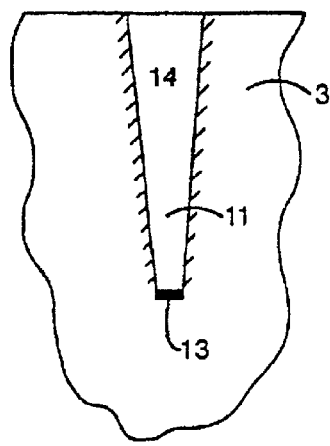
Figure 7:
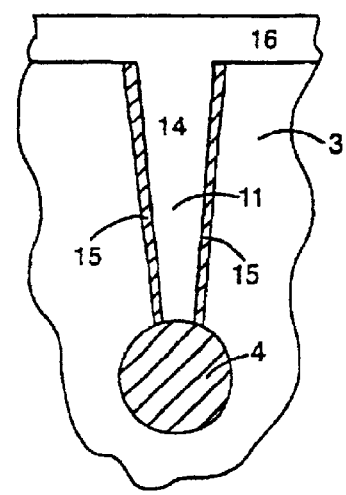

FIGS. 5 to 7 show another exemplary embodiment of the invention's method for fabricating a semiconductor component. In this method, trenches 11 are etched into the semiconductor region 3, the trenches having a V-shaped cross section whose area forms an angle of a few degrees with respect to the surface of the semiconductor region 3. An implantation with boron ions, for example, is then performed, as is illustrated by arrows 12. In the course of this ion implantation, the boron ions preferably penetrate into the bottom region 13 of the trench 11, while only relatively few boron ions pass into the side walls of the trench. In other words, there is a low concentration of boron ions in the side walls of the trench 11, while the concentration is high in the bottom region 13. Instead of boron ions, it is also possible to use other ions.

Afterward, as is shown in FIG. 6, the trench 11 is filled with silicon dioxide 14. Instead of silicon dioxide, it is also possible, of course, to use another suitable material, if appropriate.

Finally, as is shown in FIG. 7, a thermal drive-in step is also performed, in the course of which the highly doped p$^+$-conducting semiconductor region 4 forms at the bottom of the trench 11, while weakly doped "filiform" p-conducting zones 15 are produced in the side walls. At the same time, a silicon dioxide layer 16 grows on the surface of the semiconductor region 3, which layer is joined to the silicon dioxide 14 in the trench 11.

FIG. 8 shows a section through a FET structure as a further exemplary embodiment of the semiconductor component according to the invention.

In this exemplary embodiment, trenches 17 are introduced into the semiconductor region 3 below the body zones 5. One side wall of the trenches 17 is doped with boron, thereby producing relatively weakly doped zones 18 which connect the semiconductor regions 4 to the zones 5 and hence a source metallization layer 23 made of aluminum, which is grounded. A gate voltage +$U_G$ is present at gate electrodes G, which are embedded in an insulating layer 19 made of silicon dioxide, while a voltage +$U_{DS}$ is applied to the drain contact 7, likewise made of aluminum for example.

The MOSFET shown in FIG. 8 can be used for example as a low-voltage MOSFET in a voltage range of about 100 V. The doping in the semiconductor region 3, which forms the drift zone, approximately corresponds to the doping of a MOSFET which is configured for 50 V. Under applied voltages +$U_G$ and +$U_{DS}$, firstly the semiconductor region 3 above the semiconductor regions 4, that is to say between the semiconductor regions 4 and the zones 5, is depleted of charge carriers. The semiconductor regions 4 then remain at the "punch-through" voltage and, as the voltage $U_{DS}$ increases further, the space charge zone starts to extend again beyond the horizontal plane formed by the semiconductor regions 4. In this case, the section between the semiconductor regions 4 acts as a junction FET and limits the voltage on the semiconductor body between the cells. The thin or filiform zone 18 enables the p$^+$-conducting semiconductor regions to be rapidly discharged after the switch-on of the semiconductor component. Filling the trench 17 with the insulating material opens up a preferred possibility for fabricating structures in which the p$^+$-conducting semiconductor regions or correspondingly n$^+$-conducting semiconductor regions in a p-conducting semiconductor region are connected to the source electrode via filiform zones 18. It goes without saying that "filiform" zones are to be understood also as zones having a strip-type or parallelepipedal cross section.

FIG. 9 shows a further exemplary embodiment of the semiconductor component according to the invention, in which, however, in contrast to the exemplary embodiment of FIG. 8, the semiconductor region 3 has a strip-shaped structure. In other words, additional strip-shaped semiconductor regions 22 are incorporated into the semiconductor region 3; they are n-doped like the rest of the semiconductor region 3 but have a higher doping concentration than this semiconductor region 15. This higher doping concentration below the gate electrodes G makes it possible to achieve a further increase in the switching speed.

Figure 10:
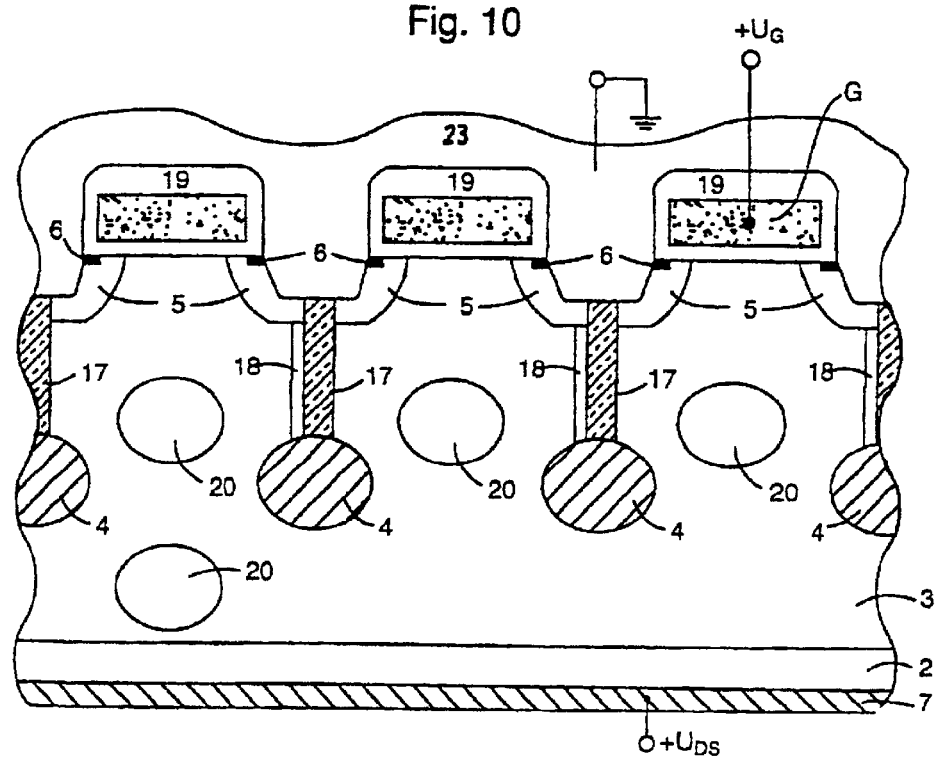

Instead of the strip-shaped semiconductor regions 22, it is also possible to provide semiconductor regions 20 in the semiconductor region 3 which are likewise n-doped but have a higher doping concentration than the semiconductor region 3 (cf. FIG. 10). Such semiconductor regions 20 may be provided above and below the plane formed by the semiconductor regions 4. These semiconductor regions 20, like the strip-shaped semiconductor regions 22, also contribute to increasing the switching speed by virtue of their higher doping concentration.

Figure 11:
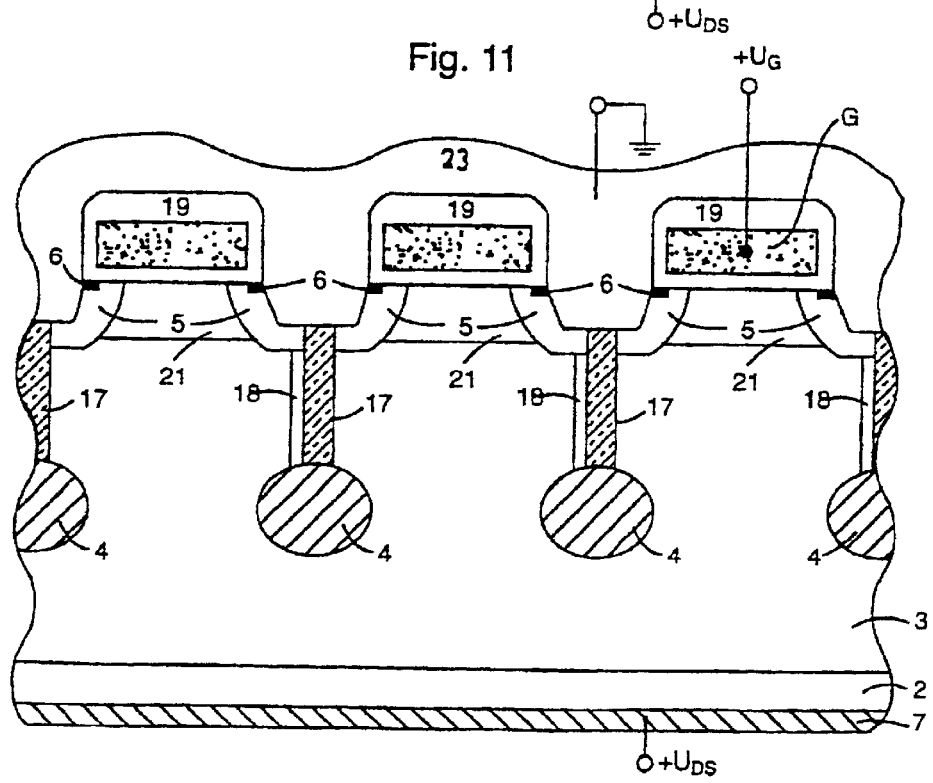

In an exemplary embodiment shown in FIG. 11, in contrast to the semiconductor component of FIG. 8, a surface region 21 of the semiconductor region 3 is more highly n-doped than the rest of the semiconductor region 3. Such a structure is particularly simple to fabricate, since the regions 21 can readily be provided with the higher dopant concentration, for example through diffusion or epitaxy. This exemplary embodiment is also distinguished by an improved switching speed.

We claim:

1. A semiconductor component, comprising:

two electrodes;

a semiconductor body of a first conductivity type, said semiconductor body including a semiconductor region of the first conductivity type provided between said two electrodes, said semiconductor region of the first conductivity type being configured to sustain a reverse voltage applied to said electrodes;

semiconductor regions of a second conductivity type disposed in at least one plane extending essentially perpendicularly to a connecting line extending between said two electrodes, the second conductivity type being opposite to the first conductivity type;

a cell array disposed under one of said electrodes in said semiconductor body;

filiform semiconductor zones of the second conductivity type being doped more weakly than said semiconductor regions of the second conductivity type; and at least some of said semiconductor regions of the second conductivity type being connected to said cell array via said filiform semiconductor zone of the second conductivity type.

2. A semiconductor component, comprising:

two electrodes;

a semiconductor body of a first conductivity type, said semiconductor body including a semiconductor region of the first conductivity type provided between said two electrodes, said semiconductor region of the first conductivity type being configured to sustain a reverse voltage applied to said electrodes;

semiconductor regions of a second conductivity type disposed in at leapt one plane extending essentially perpendicularly to a connecting line extending between said two electrodes, the second conductivity type being opposite to the first conductivity type;

a cell array disposed under one of said electrodes in said semiconductor body;

filiform semiconductor zones of the second conductivity type having a cross-sectional configuration selected from the group consisting of a cross-sectional configuration of a cylinder, a cross-sectional configuration of a parallelepiped, and a cross-sectional configuration of a strip; and at least some of said semiconductor regions of the second conductivity type being connected to said cell array via said filiform semiconductor zones of the second conductivity type.

3. The semiconductor component according to claim 1, wherein:

said semiconductor body has an edge region; and given ones of said semiconductor regions of the second conductivity type are disposed in said edge region of said semiconductor body and are configured as floating semiconductor regions.

4. The semiconductor component according to claim 1, including:

gate electrodes; and said semiconductor region of the first conductivity type having relatively more weakly doped zones and relatively more heavily doped zones extending in a direction between said two electrodes such that said semiconductor regions of the second conductivity type are provided in said relatively more weakly doped zones, and such that said relatively more heavily doped zones extend in said semiconductor body substantially below said gate electrodes.

5. The semiconductor component according to claim 1, wherein:

said semiconductor region of the first conductivity type has a first dopant concentration; and doped zones of the first conductivity type are incorporated into said semiconductor region of the first conductivity type, said doped zones have a second dopant concentration greater than said first dopant concentration.

6. The semiconductor component according to claim 1, including:

gate electrodes; and said semiconductor region of the first conductivity type including surface zones disposed below said gate electrodes and doped more heavily than a remainder of said semiconductor region of the first conductivity type.

7. A semiconductor component, comprising:

two electrodes;

a semiconductor body of a first conductivity type, said semiconductor body including a semiconductor region of the first conductivity type provided between said two electrodes, said semiconductor region of the first conductivity type being configured to sustain a reverse voltage applied to said electrodes;

semiconductor regions of a second conductivity type disposed in at least one plane extending essentially perpendicularly to a connecting line extending between said two electrodes, the second conductivity type being opposite to the first conductivity type;

a cell array disposed under one of said electrodes in said semiconductor body;

filiform semiconductor zones of the second conductivity type having a dopant concentration of less than $10^{16}$ charge carriers $cm^{-3}$; and at least some of said semiconductor regions of the second conductivity type being connected to said cell array via said filiform semiconductor zones of the second conductivity type.

8. The semiconductor component according to claim 1, wherein each of said filiform semiconductor zones has a center, an outer edge and a total charge integrated from said outer edge to said center, said filiform semiconductor zones are configured such that said total charge is less than a breakdown charge.

9. The semiconductor component according to claim 2, wherein said filiform semiconductor zones are doped more weakly than said semiconductor regions of the second conductivity type.

* * * * *